United States Patent [19]
Dlugokecki

[11] Patent Number: 5,318,926
[45] Date of Patent: Jun. 7, 1994

[54] METHOD FOR PACKAGING AN INTEGRATED CIRCUIT USING A RECONSTRUCTED PLASTIC PACKAGE

[76] Inventor: Joseph J. Dlugokecki, 13666 Quiet Hills Dr., Poway, Calif. 92064

[21] Appl. No.: 11,957

[22] Filed: Feb. 1, 1993

[51] Int. Cl.[5] ..................... H01L 21/48; H01L 21/52; H01L 21/56; H01L 21/58
[52] U.S. Cl. ................................. 437/210; 437/211; 437/214; 437/219; 437/974; 437/923
[58] Field of Search ............... 437/210, 923, 974, 219, 437/211, 214

[56] References Cited
U.S. PATENT DOCUMENTS

| | | | |
|---|---|---|---|
| 5,138,430 | 8/1992 | Gow, 3rd et al. | 437/219 |
| 5,149,662 | 9/1992 | Eichelberger | 437/209 |

FOREIGN PATENT DOCUMENTS

| | | | |
|---|---|---|---|
| 60-124834 | 7/1985 | Japan | 437/923 |
| 2278740 | 11/1990 | Japan | 437/219 |

*Primary Examiner*—Robert Kunemund
*Assistant Examiner*—David E. Graybill
*Attorney, Agent, or Firm*—Lisa P. Weinberg

[57] ABSTRACT

A method of re-configuring any pre-fabricated plastic package (with or without a silicon chip and wires inside) so that an integrated circuit chip can be installed and interconnected for normal use. A pre-molded plastic package is abraded over (or molded to expose) the die attach pad and the wire bond pads. Advantageously, the encapsulating material is removed without damaging the plating material on the lead frame. A new chip is then mounted onto the chip mounting pad and new wire bonds are connected between the new chip and the lead frame. Encapsulating material, such as epoxy, is then placed over the chip and wire bonds and cured.

14 Claims, 3 Drawing Sheets

METHOD FOR PACKAGING AN INTEGRATED CIRCUIT USING A RECONSTRUCTED PLASTIC PACKAGE

FIELD OF THE INVENTION

The present invention relates in general, to encapsulated plastic packages for integrated circuit (silicon) chips and, more specifically, to a pre-fabricated encapsulated package for integrated circuit chips having a cavity formed therein which exposes the lead frame and is reconstructed with the desired integrated circuit.

BACKGROUND

The process of designing and producing a new integrated circuit device (silicon chip) is very time consuming and requires the efforts of very talented and educated individuals. When a new integrated circuit is designed, the first article produced must be tested as soon as possible to verify that the device is performing in accordance with the design requirements.

The standard, most used process to package an integrated circuit die has been the plastic package, constructed primarily of a metal lead frame and a polymeric insulating material. Because the process of encapsulating die in molded plastic packages can be easily automated, plastic packages are relatively inexpensive compared to ceramic or hybrid hermetic packages and consequently have become the mainstay of the electronics industry.

With a few modifications, the basic assembly process for plastic encapsulation can be used to construct a variety of package types. For example, FIG. 1 illustrates a pin-in-hole package: a dual-in-line package (DIP). FIGS. 2-3 illustrate two surface mount packages: a plastic leaded chip carrier (PLCC) and a quad flatpack (QFP), respectively. Each of these plastic packages are constructed from the same basic assembly techniques, which techniques are well known in the art.

Approximately 80% of the integrated circuits that are sold and produced today are packaged or encapsulated in epoxy using the technique described above. The majority of the integrated circuit packaging industry now resides in countries outside of the United States. Heretofore, there has been relatively little investment in the United States in developing the required hardware tooling and equipment required to accomplish this process, which is very expensive. Thus, most of the tooling and equipment necessary for this process is also manufactured outside the United States. This means that, in most cases, if a company who designs integrated circuits requires integrated circuit dice packaged in epoxy encapsulation, they must pay the price for the offshore service and wait the time it takes for delivery. For companies eager to produce and evaluate new prototype devices, this can translate into costly delays.

Another popular method of packaging the integrated circuit die is to use a package constructed from ceramic. However, ceramic packaging is relatively expensive and is used primarily for high performance, military applications.

If the design is such that performance of the device can be characterized in a substitute package such as a ceramic package, then this provides an alternative method for quick turnaround, providing, of course, that the package is available. However, in many cases, a ceramic package is a poor substitute for simulating the performance of the desired encapsulated device, which is the intended production configuration. That is, in some designs, the function of the integrated circuit die is affected by the presence of the encapsulating material on its surface and the dimensions of the package conductor paths (leads). Thus, it becomes necessary to re-evaluate and validate the design in the final production package configuration. Another disadvantage of the use of ceramic packages for prototype units is that it necessitates a modification of test sockets and printed circuit boards to receive the prototype ceramic packages in order to test and validate the new design.

SUMMARY OF THE INVENTION

The expense of configuring the prototype package into a substitute ceramic package and the expense of using offshore encapsulated prototype packages can be eliminated using the present invention. The present invention allows the installation of a new integrated circuit chip (die) in a reconstructed encapsulated package which is mechanically identical to the production part.

The present invention is directed towards a reconstructed plastic package and a method of re-configuring any pre-fabricated plastic package (with or without an existing silicon chip and wires inside) so that an integrated circuit die can be installed and interconnected for normal use.

The present invention, advantageously, takes a pre-fabricated plastic package and forms a cavity over the chip mounting area and the area of the lead frame where the wire bonds normally connect to the chip using one of several methods of abrasion. Only a thin wall is left around the perimeter of the package. A new chip is mounted onto the chip mounting pad and new wire bonds are connected between the new chip and the lead frame. The cavity is then filled with a polymeric insulating material and cured.

A key feature of the reconstructed package of the present invention is that the cavity is formed by abrading the encapsulating material without damaging the plating material on the lead frame. This is a very critical parameter since, without this step, it would be extremely difficult (if not impossible) to connect the new wire bonds to the lead frame. The net result is a plastic package that looks and performs identically to the same device that has been transfer molded using the more costly and time-consuming method in the prior art.

The present invention further contemplates a method of packaging an integrated circuit chip by modifying a pre-fabricated plastic package, removing existing encapsulating material to form a cavity over the chip and wire bond pads, and reconstructing the package by adding insulating material back into the cavity. The formation of the cavity preferably includes the steps of gross removal of the encapsulating material (and any existing chip and wires), using a dentist drill or other mechanical grinding technique to within 2-5 mils of the lead frame; precision removal of the remaining encapsulating material using a sand blaster; and then cleaning the device using liquid impingement, plasma etching or ultrasonic techniques. Advantageously, the precision material removal step does not damage the silver or gold plating from the wire bond pads.

In an alternative method, the prefabricated plastic package obtained could have the cavity pre-molded therein so that the material removal and cleaning steps would not be necessary. The remaining steps of die attachment, wire bonding, and encapsulation would then be performed, as described above.

The invention thus provides a process alternative whereby the die can be encapsulated at a very low per unit cost and in only minutes per unit without the need to go offshore.

BRIEF DESCRIPTION OF THE DRAWINGS

Further features and advantages of the present invention may be more readily understood with reference to the following description taken in conjunction with the accompanying drawings, in which.

DESCRIPTION OF THE PREFERRED EMBODIMENT

The following description is of the best mode presently contemplated for practicing the invention. This description is not to be taken in a limiting sense but is made merely for the purpose of describing the general principles of the invention. The scope of the invention should be ascertained with reference to the issued claims. In the description of the invention that follows, like numerals or reference designators will be used to refer to like parts or elements throughout.

First, a plastic package is fabricated or procured using the techniques that are well known in the art, with or without installation of an integrated circuit chip. In other words, a plastic package is produced which looks exactly like the desired plastic package but may not necessarily contain an integrated circuit die. These devices (also known as "dummy" packages) are being produced and sold routinely and quite inexpensively. They are purchased primarily for the purpose of adjusting (setting up) automatic handling equipment for electrical testers and printed circuit board soldering equipment.

The encapsulation process for fabricating the "dummy" plastic packages is known as transfer molding. For a complete description on transfer molding, and the fabrication of plastic packages in general, see for example, *Packaging—Electronic Materials Handbook*, 1989, Vol. 1, pp. 470–480, published by ASM International, which reference is hereby incorporated herein by reference.

Figure 1:
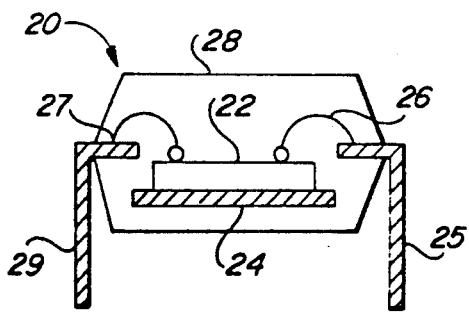
FIG. 1 shows an cross-sectional view of a plastic dual-in-line package (DIP), as is known in the prior art.

Briefly, and with reference to the prior art plastic package shown in FIG. 1, the fabrication of a plastic package 20 (as is known in the prior art) begins with a metal lead frame 25 that is either stamped or chemically etched. The choice of lead frame material depends on die attach methods, reliability, thermal requirements, and mounting requirements (through-hole or surface mount). The lead frame 25 may be comprised of copper, "Kovar", nickel, alloy 42, or aluminum, with the two most commonly used materials being alloy 42 and copper. However, wire bonds do not readily adhere to these bare materials. Thus, to provide a consistent and reliable wire bond attachment, one very critical step in preparing the lead frame prior to attachment of the die is to plate the wire bonding surfaces (i.e., the tips of the fingers nearest the die, also referred to hereinafter as "wire bond pads") with silver or gold. The leads extending from the resultant package can then be soldered directly to a printed circuit board.

Once a die 22 has been cut or diced from a wafer (not shown), the die 22 is attached to the center pad 24 of the lead frame 25, hereinafter referred to as the die attach pad 24. Attachment can be made by using a gold-silicon eutectic or a polymer adhesive, such as epoxy or polyimide. Following die attachment, each of a plurality of contact pads (not shown) on the die 22 are interconnected to a respective one of a plurality of wire bond pads 27 on the lead frame 25 by wire bonds 26. The wire bonding process can be accomplished in a variety of ways, for example, by ultrasonic vibration pressure, by thermocompression bonding, or by a combination of both methods (called thermosonic bonding).

After the wires bonds 26 have been attached, the die 22 and wire bonds 26 are encapsulated in a plastic or polymeric material defined by the outline 28. The encapsulating material serves as a dielectric insulator and shields against environmental degradation. The encapsulation process, known in the art as transfer molding, is the method used to mold thermosetting polymers (i.e., polymers that are fluid at low temperatures but which react irreversibly when heated to form a highly cross-linked network which is no longer capable of being melted). The result is encapsulation of the integrated circuit die 22 and the wire bonds 26 within the encapsulating material 28, with the legs 29 of the lead frame 25 extending from the body of the package. This encapsulation process provides an electrical connection from the contact pads on the die to the outside world and provides excellent protection to the silicon chip and the wires.

The encapsulating materials used, as indicated above, are thermosetting polymers. The encapsulating material ideally has the following properties: high purity (particularly with respect to ionic contaminants); excellent adhesion to other packaging materials (such as Si, passivation, lead frame, etc.); poor adhesion to mold surfaces; impermeability to moisture and low moisture absorption; sufficient rigidity to protect the die; low coefficient of thermal expansion (CTE); low elastic modulus; heat resistance sufficient to withstand soldering operations; ease of processing; and low cost.

While no polymer material satisfies all of these requirements, formulations of epoxy resins, hardeners, and inorganic fillers have been developed and are in widespread use. Epoxies are useful as encapsulant materials due to a combination of factors including low cure shrinkage, fast cure speed, a polar nature, and the ability to be blended with a wide variety of modifiers to impart the desired mechanical properties. Epoxy monomers and prepolymers are commercially available in a wide variety of viscosities, and thus are easily tailored to meet a particular molding requirement. Other thermosetting polymers, such as silicones and unsaturated polyesters, are also employed to a lesser degree. The primary use of silicone polymers is in high-temperature applications (in the range of 200° C.) that warrant the extra cost. Advantages of unsaturated resins include extremely fast cure kinetics, the cure reaction does not generate any by-products, and low cost, however, they also have inferior strength and environmental resistance compared to epoxies and silicones.

In the preferred embodiment, described in more detail below, the preferred encapsulating material is epoxy and epoxy-based resins (hereinafter referred to simply as "epoxy"). However, it is understood that any of the plastic or polymeric insulating materials described above, or any plastic or polymeric material yet to be invented which have similar properties, could be utilized with the present inventive method and are within the scope of the present invention.

Figure 2:
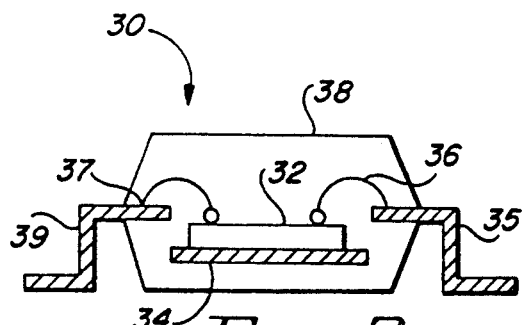
FIG. 2 shows an cross-sectional view of a plastic quad flatpack (QFP), as is known in the prior art.
Figure 3:
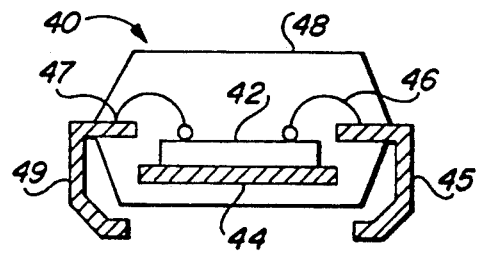
FIG. 3 shows an cross-sectional view of a plastic leaded chip carrier (LCC), as is known in the prior art.

FIGS. 1–3 show, respectively, a dual-in-line package (DIP) 20, a quad flatpack (QFP) 30, and a plastic leaded chip carrier (PLCC) 40, which are known in the prior art. FIGS. 1–3 illustrate but three examples of plastic packages, among the many plastic packages known in the art, which may be modified by the method of the present invention. Other plastic packages that may be modified using the present inventive method include, but are not limited to, single-in-line packages (SIPs), zigzag-in-line packages (ZIPs), quad-in-line packages (QUIPs), small outline (SO) packages, fine-pitch quad flatpacks (FQFPs), pin grid arrays (PGAs), etc. For a complete description of the various plastic package families and their characteristics, see for example, *Electronic Packagingand Interconnection Handbook*, Charles A. Harper, 1991, pp. 6.41–6.49, which reference is incorporated herein by reference. It is understood that the packages shown in FIGS. 1–3 are presented for illustration purposes only, and that the present invention can be extended to all pre-fabricated plastic packages.

The packages shown in FIGS. 1–3 are included to illustrate the similarities in construction in plastic packages. Each package (20, 30 and 40) has, respectively, a die (22, 32 and 42) mounted onto a die attach pad (24, 34 and 44), a lead frame (25, 35 and 45), and a set of wire bonds (26, 36 and 46). Each lead frame contains a plurality of leads or fingers (not shown) for interconnection to a plurality of contact pads (also not shown) on each die via the respective set of wire bonds. Each package (20, 30 and 40) includes encapsulation material (defined by outline 28, 38 and 48, respectively). Each lead further has a plurality of wire bond pads (27, 37, 47) and legs (29, 39, 49) which extend from the encapsulated portion (28, 38, 48) of the package, respectively.

Figure 4:
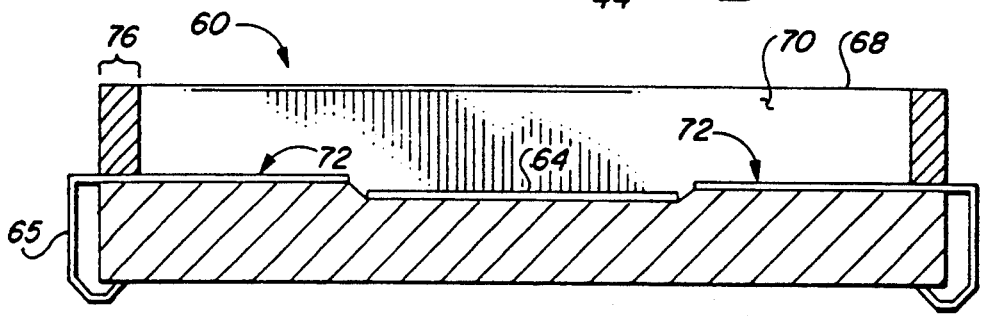
FIG. 4 shows a cross-sectional view of one embodiment using a pre-fabricated, plastic leaded chip (LCC) carrier modified in accordance with the present inventive method and illustrating the area which is abraded and removed, thus exposing the lead frame.
Figure 5:
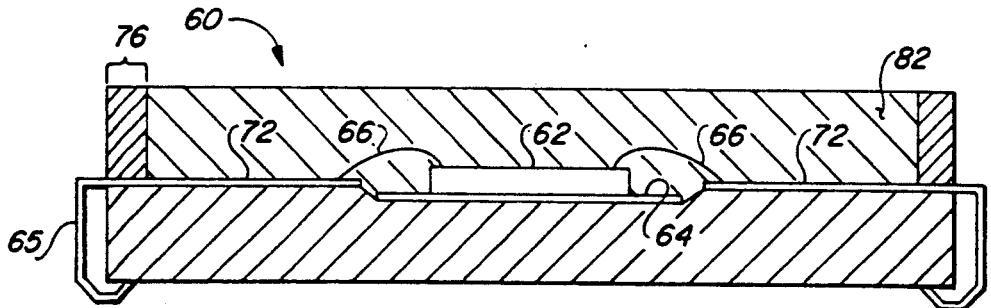
FIG. 5 shows a cross-sectional view of the embodiment shown in FIG. 4 using a pre-fabricated, plastic leaded chip carrier (LCC) re-constructed in accordance with the teachings of the present invention.
Figure 6:
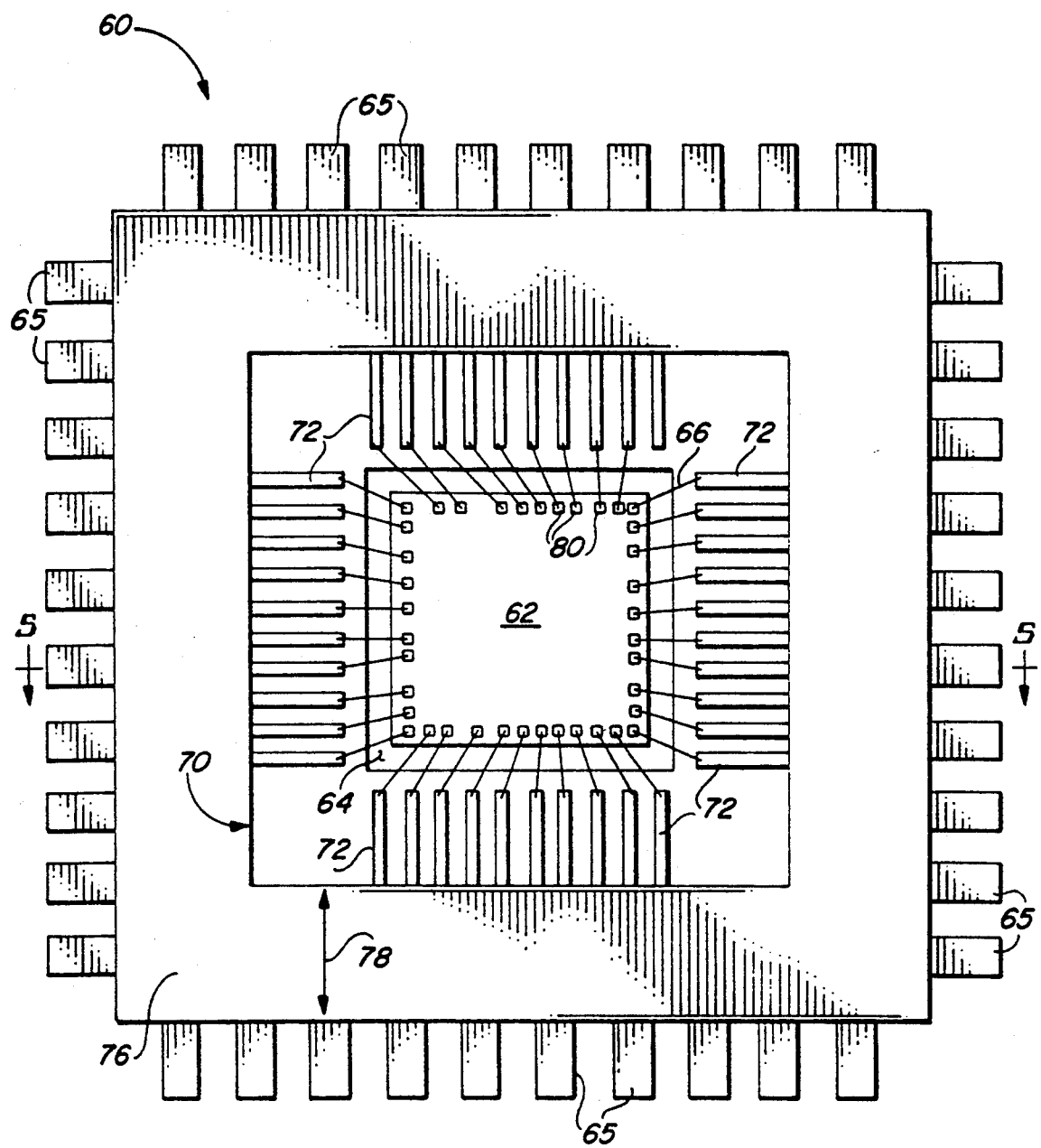
FIG. 6 shows a plan view of an integrated circuit chip (die) mounted onto the die attach pad of the plastic leaded chip carrier shown in FIGS. 4 5.

FIGS. 4–6 illustrate a pre-fabricated plastic leadless chip carrier (LCC) modified using the method of the present invention. While the following will be directed toward a reconstructed plastic leadless chip carrier, it is understood that any of the plastic packages known in the art may be modified and reconstructed using the present inventive method and are within the scope of the present invention.

FIGS. 4 and 5 show a cross-sectional view of a prefabricated plastic leadless chip carrier (LCC) 60 before and after a die is attached, respectively, taken across the lines 5—5 shown in FIG. 6. FIG. 6 shows a plan view of the leadless chip carrier shown in FIG. 5.

As seen in FIG. 4, a plastic leadless chip carrier 60 is shown having a die attach pad 64 and a lead frame 65. The original outer dimension of the package is indicted by outline 68. A cavity 70 is formed over the die attach pad 64 and a portion of the lead frame 72 (i.e., wire bond pads 72). The removal of the epoxy material will be described in more detail below in the description of the present inventive method.

As shown in FIGS. 5 and 6, a die 62 is mounted onto the die attach pad 64 and a plurality of wire bonds 66 are used to connect the plurality of input/output pads 80 on the chip 62 to a respective one of the wire bond pads 72 on the lead frame 65. The cavity 70 (FIG. 4) is then filled with epoxy 82. A wall 76 is left on all four sides of the package 60 (best seen in FIG. 6) to support the epoxy 82 during the curing process. The width 78 of the wall 76 must be at least wide enough to expose the wire bond pads 72 on the lead frame 65, and can be sufficiently narrow enough so long as it provides enough support to hold the epoxy 82 during the curing process.

Figure 7:
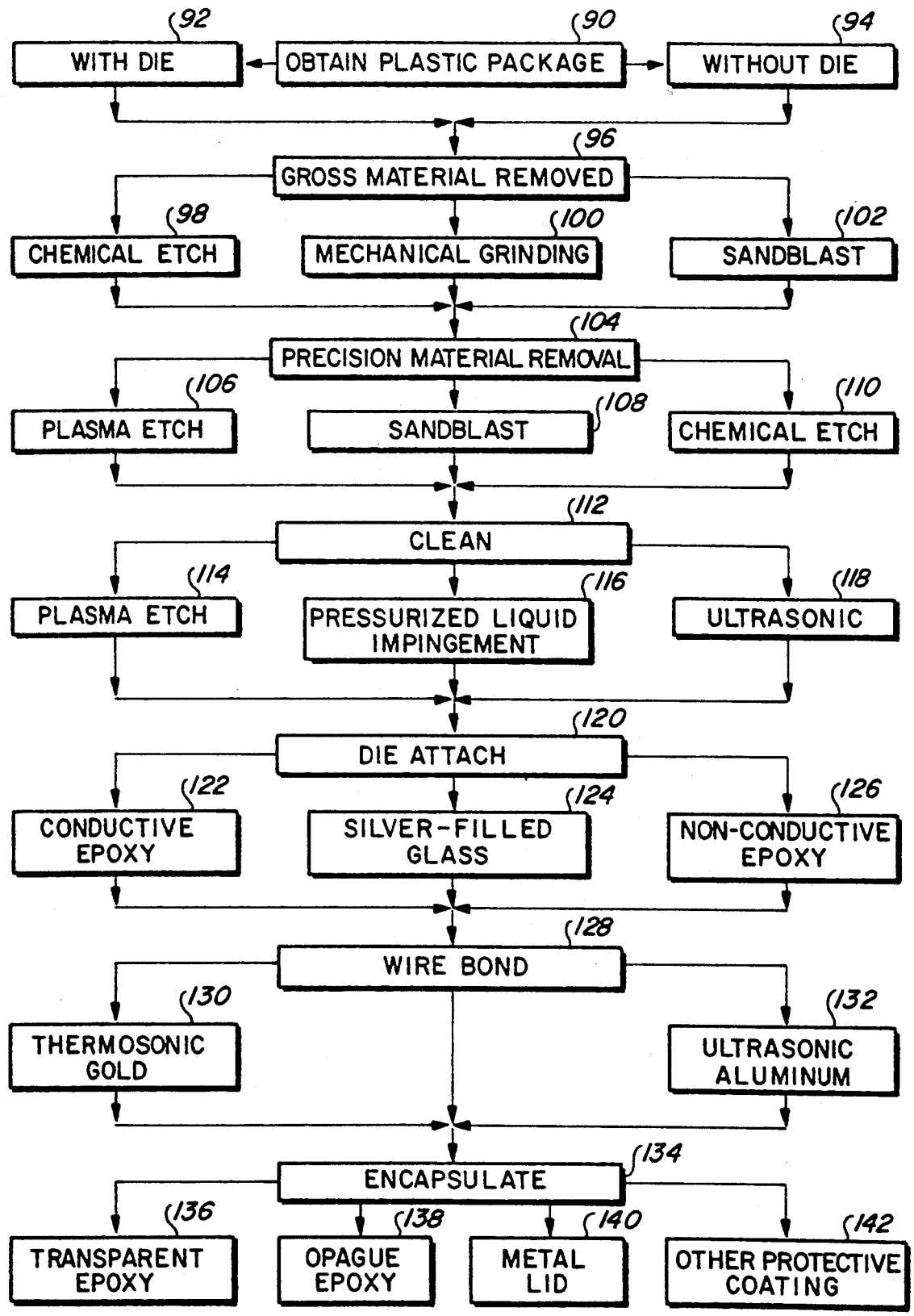
FIG. 7 describes the process steps necessary to reconstruct the pre-fabricated, plastic package of the present invention and FIG. 8 describes another embodiment of the present invention.

The process of removing epoxy to create the cavity 70 is described more completely with reference to the process diagram shown in FIG. 7. Block 90, in FIG. 7, comprises the step of obtaining (either by fabricating or by procuring) a desired plastic package, hereinafter referred to as "dummy" device. As indicated in Blocks 92 and 94, it does not matter if the plastic package contains a dummy die inside since the removal process will also remove any existing die and wire bonds.

In Block 96, the present invention consists of the step of gross removal of epoxy and any existing die from the surface of the dummy device. The original condition of the silver or gold plating must be sufficiently preserved to allow attachment of a die and wire bonds using standard techniques. This is accomplished by clearing away the majority of the solid epoxy and any existing die using a mechanical grinding technique such as with a dentist's drill, down to within 2 to 5 mils of the surface of the lead frame. The epoxy is removed only in the center region 70 of the package leaving vertical walls 76 around the perimeter of the package 60 to retain the liquid epoxy 82 which will fill the space after installation of the new die 62.

Currently known process options, as defined by this invention, for gross removal of the surface epoxy may include chemical etching (Block 98), mechanical grinding (Block 100), and sand blasting (Block 102). In the preferred embodiment, the mechanical grinding technique is used, i.e., a diamond impregnated dental burr is used. The hand piece of the drill is rigidly held by an arm that allows the hand piece to move only in the vertical direction. The vertical position is precisely controlled with a micrometer. The dental burr is lowered and cuts into the encapsulant. The burr is lowered to within 2-5 mils if the surface of the lead frame. At this point, the dummy package is moved on the horizontal plane and the side of the diamond impregnated dental burr pulverizes the solid epoxy and/or the die. The area of removal of the epoxy is controlled by viewing the process under a microscope while moving the package (which is rigidly held in a chuck) on the horizontal plane. This process can easily be automated by employing servo motors controlled by digital logic circuits.

Block 104 comprises the steps of precision material removal. This can be achieved using plasma etching (Block 106), sand blasting (Block 108) or chemical etching (Block 110). In the preferred embodiment, the final several mils of material are removed using a precision, hand held sand blaster under a magnifying glass. A very fine sodium bicarbonate is used as the sand blast media. This sand blasting process will remove the epoxy at a much faster rate than it will the silver, therefore the epoxy can be removed without causing significant damage to the silver.

Next is the cleaning step (Block 112) in preparation of the removal of the residual sandblast material. Cleaning can be achieved using either a plasma etch (Block 114), a pressurized liquid impingement (Block 116), or ultrasonic cleaning (Block 118). In the preferred embodiment, cleaning is accomplished using deionized water which is delivered to the surface of the sand blasted areas using a high pressure pulsating liquid ejector device such as that used for cleaning between teeth (a water pick). To remove the water, the water pick washing step is repeated using electronic grade alcohol. Alternatively, ultrasonic cleaning in deionized water and alcohol and/or plasma etching may be used in place of the high pressure liquid impingement cleaning step.

Block 120 indicates the die attach step. The new die 62 is then installed using thermally cured conductive epoxy (Block 122), silver filled glass (Block 124), or non-conductive epoxy (Block 126), as desired by the application.

The next step (Block 128) is to interconnect between the input/output contact pads 80 on the die 62 to the wire bond pads 72 on the lead frame 65. This is accomplished using one of the known wire bonding methods, preferably ultrasonic aluminum (Block 130) or thermosonic gold wire (Block 132) bonding techniques. During the encapsulating step (Block 134), the cavity 70 is then filled with epoxy and cured, typically at 150°-200° C. for 2-4 hours. As indicated in Blocks 136 and 138, the epoxy may be transparent or opaque, respectively. Alternatively, a metal lid (Block 140) or any other protective cover or coatings (Block 142), such as for alpha particle protection or a moisture barrier, could be substituted for, or used in addition to, the epoxy fill.

In an alternative method, the plastic package obtained in step 90 could have the cavity pre-molded therein so that the material removal and cleaning steps (92, 96, 100, 104 and 112) would be unnecessary. The remaining steps of die attachment 120, wire bonding 128, and encapsulation 134 would then be performed, as described above.

Figure 8:
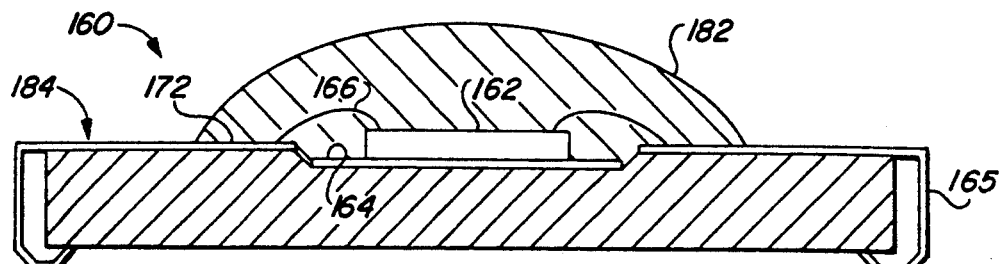

In yet another embodiment, shown in FIG. 8, the plastic package 160 does not include the vertical walls 76 (shown in FIG. 4). For example, in very small packages (approx. 150 mils wide), there may not be enough room to include vertical walls with a sufficient thickness to hold the epoxy. For these smaller packages, the encapsulation material can be removed over the entire top surface 184 of the package 160. The liquid epoxy 182 may then be placed over, or "blobbed", on top of the mounted chip 162, the die attach pad 164, the wire bonds 166 and the wire bond pads 172. The epoxy 182 can be easily formulated to have a viscosity such that the chip 162 and wire bonds 166 are sufficiently protected. Since the epoxy is non-conductive, even if the epoxy ran over the edges of the package, the device would still be functional. While the package may not be precisely the same outline as a custom built device, the objectives of the packaging technique are still met.

The end product is an electrically functioning device with external dimensions duplicating the original dummy device and the transfer molded device produced using the prior art.

In this highly competitive semiconductor industry, it is always economically advantageous to decrease the amount of time it takes to get a new product to market. The present invention will dramatically reduce the time to get the product to market by allowing the assembly and testing of the first article units in less time as compared to currently used methods. Even if ceramic packages are available that are acceptable for prototype use, plastic packages produced using the inventive method can, in most cases, be provided at a much lower cost.

Thus, the invention advantageously utilizes rejected electrical test devices which normally are discarded as the basic starting element to mount a new integrated circuit die. While the above description has been described to provide a fast turn-around for prototypes, it should be apparent to one skilled in the art that the present invention may provide an inexpensive method of packaging a die for production use as well. This may be of particular value to customers with low volume and do not want to incur the tooling costs for an off-shore program.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A method of packaging an integrated circuit chip, comprising the steps of:
   a) obtaining a pre-fabricated package, the package having a lead frame encapsulated in a first polymeric insulating material, the lead frame having a die attach pad and a plurality of fingers, each finger having a wire bond pad thereon;
   b) exposing the die attach pad and the wire bond pads by removing the encapsulating material thereover;
   c) mounting a chip onto the exposed die attach pad, the chip having a plurality of contact pads thereon;
   d) connecting a plurality of wire bonds between the plurality of contact pads on the chip and a respective one of the plurality of wire bond pads; and
   e) encapsulating the chip and the plurality of wire bond pads in a second polymeric insulating material.

2. The method recited in claim 1, wherein the step of exposing the die attach pad and the wire bond pads comprises the steps of:
   removing the first polymeric insulating material within 2-5 mils above the surface of the die attach pad and the wire bond pads using a first removal technique; and
   removing the remaining 2-5 mils of the first polymeric insulating material above the surface of the die attach pad and the wire bond pads using a second removal technique which preserves the plating material thereon.

3. The method recited in claim 2, wherein the first removal technique comprises the step of mechanically grinding the first polymeric insulating material.

4. The method recited in claim 2, wherein the first removal technique comprises the step of chemically etching the first polymeric insulating material.

5. The method recited in claim 2, wherein the first removal technique comprises the step of sand blasting the first polymeric insulating material.

6. The method recited in claim 2, wherein the first removal technique includes the step of removing an existing chip.

7. The method recited in claim 2, wherein the second removal technique comprises the step of plasma etching the first polymeric insulating material.

8. The method recited in claim 2, wherein the second removal technique comprises the step of chemical etching the first polymeric insulating material.

9. The method recited in claim 2, wherein the second removal technique comprises the step of sand blasting the first polymeric insulating material.

10. The method recited in claim 1, wherein the step of exposing the die attach pad and the wire bond pads comprises the step of:

forming a wall along each of the four sides of the package so that the second polymeric material used in the encapsulating step is held within the walls.

11. The method recited in claim 1, further comprises the steps of:
cleaning the die attach pad and the wire bond pads by delivering deionized water using a high pressure pulsating liquid ejector device; and
removing the deionized water by delivering electronic grade alcohol using a high pressure pulsating liquid ejector device.

12. The method recited in claim 1, further comprises the step of:
ultrasonic cleaning the die attach pad and the wire bond pads in de-ionized water and alcohol.

13. The method recited in claim 1, further comprises the step of cleaning the die attach pad and the wire bond pads by plasma etching.

14. The method recited in claim 1, wherein the step of encapsulating the die and the wire bonds in the second polymeric insulating material comprises the step of:
placing a thermosetting polymeric material over the die and the wire bonds; and
curing the thermosetting polymeric material.

* * * * *